United States Patent
Park et al.

(10) Patent No.: US 10,326,472 B2
(45) Date of Patent: *Jun. 18, 2019

(54) LOW DENSITY PARITY CHECK ENCODER HAVING LENGTH OF 64800 AND CODE RATE OF 4/15, AND LOW DENSITY PARITY CHECK ENCODING METHOD USING THE SAME

(71) Applicant: ELECTRONICS AND TELECOMMUNICATIONS RESEARCH INSTITUTE, Daejeon (KR)

(72) Inventors: Sung-Ik Park, Daejeon (KR); Heung-Mook Kim, Daejeon (KR); Sun-Hyoung Kwon, Daejeon (KR); Nam-Ho Hur, Sejong (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/709,191

(22) Filed: Sep. 19, 2017

(65) Prior Publication Data
US 2018/0006663 A1  Jan. 4, 2018

Related U.S. Application Data

(63) Continuation of application No. 14/496,654, filed on Sep. 25, 2014, now Pat. No. 9,800,266.

(30) Foreign Application Priority Data

Aug. 14, 2014 (KR) .................. 10-2014-0106180
Sep. 11, 2014 (KR) .................. 10-2014-0120014

(51) Int. Cl.
  H03M 13/00 (2006.01)
  H03M 13/11 (2006.01)
  H03M 13/25 (2006.01)

(52) U.S. Cl.
  CPC ...... *H03M 13/1102* (2013.01); *H03M 13/116* (2013.01); *H03M 13/1177* (2013.01);
  (Continued)

(58) Field of Classification Search
  CPC .......... H03M 13/116; H03M 13/1102; H03M 13/1177; H03M 13/616; H03M 13/1185; H03M 13/255; H04L 1/0057
  (Continued)

(56) References Cited

U.S. PATENT DOCUMENTS 7,752,520 B2* 7/2010 Xia .................. H03M 13/6393
  714/752
2007/0283219 A1* 12/2007 Park .................. H03M 13/116
  714/758

(Continued)

FOREIGN PATENT DOCUMENTS

CA    2940275 A1  8/2015
KR  10-2007-0058438 A  6/2007

(Continued)

OTHER PUBLICATIONS

Yiyan Wu et al., "Cloud Transmission: A New Spectrum-Reuse Friendly Digital Terrestrial Broadcasting Transmission System", IEEE Transactions on Broadcasting, Sep. 2012, pp. 329-337, vol. 58, No. 3.

(Continued)

*Primary Examiner* — James C Kerveros

(57) ABSTRACT

A low density parity check (LDPC) encoder, an LDPC decoder, and an LDPC encoding method are disclosed. The LDPC encoder includes first memory, second memory, and (Continued)

a processor. The first memory stores an LDPC codeword having a length of 64800 and a code rate of 4/15. The second memory is initialized to 0. The processor generates the LDPC codeword corresponding to information bits by performing accumulation with respect to the second memory using a sequence corresponding to a parity check matrix (PCM).

5 Claims, 5 Drawing Sheets

(52) U.S. Cl.
CPC ..... *H03M 13/1185* (2013.01); *H03M 13/616* (2013.01); *H03M 13/255* (2013.01)

(58) Field of Classification Search
USPC .................................. 714/752, 758
See application file for complete search history.

(56) References Cited

U.S. PATENT DOCUMENTS

| | | |
|---|---|---|
| 2008/0178065 A1 | 7/2008 | Khandekar et al. |
| 2010/0153823 A1* | 6/2010 | Noda .............. H03M 13/033 714/777 |
| 2010/0211841 A1* | 8/2010 | Cao ............... H03M 13/1102 714/748 |
| 2011/0191650 A1* | 8/2011 | Yokokawa ........ H03M 13/1137 714/752 |
| 2011/0252285 A1* | 10/2011 | Kumar ............ H03M 13/1188 714/752 |
| 2011/0283158 A1 | 11/2011 | Yang et al. |
| 2012/0173949 A1* | 7/2012 | Liu ................. H03M 13/116 714/752 |
| 2012/0210189 A1* | 8/2012 | Sugihara .......... H03M 13/1102 714/752 |
| 2012/0240001 A1* | 9/2012 | Abu-Surra ........ H03M 13/033 714/752 |
| 2014/0157079 A1 | 6/2014 | Park et al. |
| 2015/0046766 A1* | 2/2015 | Shinohara ........ H03M 13/036 714/752 |
| 2015/0270853 A1* | 9/2015 | Jeong ............ H03M 13/2792 714/752 |

FOREIGN PATENT DOCUMENTS

| | | |
|---|---|---|
| KR | 10-2013-0135746 A | 12/2013 |
| WO | WO 2006/001666 A2 | 1/2006 |

OTHER PUBLICATIONS

"Digital Video Broadcasting (DVB); Frame structure channel coding and modulation for a second generation digital terrestrial television broadcasting system (DVB-T2)", Final draft ETSI EN 302 755, Oct. 2010, pp. 1-177, vol. 1.2.1, European Telecommunications Standards Institute.

"Proposal to the ATSC 3.0 PHY Layer CfP Cloud Transmission for the ATSC 3.0 PHY Layer," A Joint Proposal by Communications Research Centre Canada and Electronics and Telecommunications Research Institute Korea, Sep. 27, 2013, pp. 1-101, CRC Canada and ETRI Korea.

"Updated Proposal to the ATSC 3.0 PHY Layer CfP Cloud Transmission for the ATSC 3.0 PHY Layer," A Joint Proposal by Communications Research Centre Canada and Electronics and Telecommunications Research Institute Korea, Oct. 21, 2013, pp. 1-138, CRC Canada and ETRI Korea.

"Updated Proposal to the ATSC 3.0 PHY Layer CfP Cloud Transmission for the ATSC 3.0 PHY Layer," A Joint Proposal by Communications Research Centre Canada and Electronics Telecommunications Research Institute Korea, Dec. 5, 2013, pp. 1-138, CRC Canada and ETRI Korea.

* cited by examiner

LOW DENSITY PARITY CHECK ENCODER HAVING LENGTH OF 64800 AND CODE RATE OF 4/15, AND LOW DENSITY PARITY CHECK ENCODING METHOD USING THE SAME

CROSS-REFERENCE TO RELATED APPLICATIONS

This application is a continuation of U.S. patent application Ser. No. 14/496,654, filed on Sep. 25, 2014, which claims the benefit of Korean Patent Application Nos. 10-2014-0106180 and 10-2014-0120014, filed Aug. 14, 2014 and Sep. 11, 2014, respectively, which are hereby incorporated by reference herein in their entirety.

BACKGROUND

1. Technical Field

The present disclosure relates generally to a low density parity check (LDPC) code that is used to correct errors occurring over a wireless channel, and, more particularly, to an LDPC code that is applicable to a digital broadcasting system.

2. Description of the Related Art

Current terrestrial television (TV) broadcasting generates co-channel interference across an area within a distance that is three times a service radius, and thus the same frequency cannot be reused in the area within the distance that is three times the service radius. An area in which the same frequency cannot be reused is called a white space. Spectrum efficiency significantly deteriorates due to the occurrence of a white space.

Accordingly, there arises a need for the development of a transmission technology that facilitates the elimination of a white space and the reuse of a frequency with an emphasis on reception robustness in order to improve spectrum efficiency.

In response to this, the paper "Cloud Transmission: A New Spectrum-Reuse Friendly Digital Terrestrial Broadcasting Transmission System" published on September of 2012 in IEEE Transactions on Broadcasting, Vol. 58, No. 3 proposes a terrestrial cloud transmission technology that facilitates reuse, does not generate a white space, and makes the construction and operation of a single frequency network easy.

Using this terrestrial cloud transmission technology, a broadcasting station can transmit the same nationwide content or locally different content over a single broadcasting channel. However, for this purpose, a receiver should receive one or more terrestrial cloud broadcast signals in an area in which signals transmitted from different transmitters overlap each other, that is, an overlap area, over a single frequency network, and then should distinguish and demodulate the received terrestrial cloud broadcast signals. That is, the receiver should demodulate one or more cloud broadcast signals in a situation in which co-channel interference is present and the timing and frequency synchronization between transmitted signals are not guaranteed.

Meanwhile, Korean Patent Application Publication No. 2013-0135746 entitled "Low Density Parity Check Code for Terrestrial Cloud Transmission" discloses an LDPC code that is optimized for terrestrial cloud transmission and exhibits excellent performance at low code rate (<0.5).

However, Korean Patent Application Publication No. 2013-0135746 is directed to a code length completely different from an LDPC code length used in the DVB broadcast standard, etc., and does not teach a specific LDPC encoding method.

SUMMARY

At least one embodiment of the present invention is directed to the provision of a new LDPC codeword having a length of 64800 and a code rate of 4/15, which is capable of being used for general purposes.

At least one embodiment of the present invention is directed to the provision of an LDPC encoding technique that is capable of efficiently performing LDPC encoding using a sequence having a number of rows equal to a value that is obtained by dividing the sum of the length of the systematic part of an LDPC codeword, that is, 17280, and the length of the first parity part of the LDPC codeword, that is, 1800, by 360.

In accordance with an aspect of the present invention, there is provided an LDPC encoder, including first memory configured to store an LDPC codeword having a length of 64800 and a code rate of 4/15; second memory configured to be initialized to 0; and a processor configured to generate the LDPC codeword corresponding to information bits by performing accumulation with respect to the second memory using a sequence corresponding to a parity check matrix (PCM).

The accumulation may be performed at parity bit addresses that are updated using the sequence corresponding to the PCM.

The LDPC codeword may include a systematic part corresponding to the information bits and having a length of 17280, a first parity part corresponding to a dual diagonal matrix included in the PCM and having a length of 1800, and a second parity part corresponding to an identity matrix included in the PCM and having a length of 45720.

The sequence may have a number of rows equal to the sum of a value obtained by dividing a length of the systematic part, that is, 17280, by a circulant permutation matrix (CPM) size corresponding to the PCM, that is, 360, and a value obtained by dividing a length of the first parity part, that is, 1800, by the CPM size.

The sequence may be represented by the following Sequence Table:

| Sequence Table |
|---|
| 1st row: 276 1754 1780 3597 8549 15196 26305 27003 33883 37189 41042 41849 42356 |
| 2nd row: 730 873 927 9310 9867 17594 21969 25106 25922 31167 35434 37742 45866 |
| 3rd row: 925 1202 1564 2575 2831 2951 5193 13096 18363 20592 33786 34090 40900 |

Sequence Table

| | |
|---|---|
| 4th row: | 973 1045 1071 8545 8980 11983 18649 21323 22789 22843 26821 36720 37856 |
| 5th row: | 402 1038 1689 2466 2893 13474 15710 24137 29709 30451 35568 35966 46436 |
| 6th row: | 263 271 395 5089 5645 15488 16314 28778 29729 34350 34533 39608 45371 |
| 7th row: | 387 1059 1306 1955 6990 20001 24606 28167 33802 35181 38481 38688 45140 |
| 8th row: | 53 851 1750 3493 11415 18882 20244 23411 28715 30722 36487 38019 45416 |
| 9th row: | 810 1044 1772 3906 5832 16793 17333 17910 23946 29650 34190 40673 45828 |
| 10th row: | 97 491 948 12156 13788 24970 33774 37539 39750 39820 41195 46464 46820 |
| 11st row: | 192 899 1283 3732 7310 13637 13810 19005 24227 26772 31273 37665 44005 |
| 12th row: | 424 531 1300 4860 8983 10137 16323 16888 17933 22458 26917 27835 37931 |
| 13th row: | 130 279 731 3024 6378 18838 19746 21007 22825 23109 28644 32048 34667 |
| 14th row: | 938 1041 1482 9589 10065 11535 17477 25816 27966 35022 35025 42536 |
| 15th row: | 170 454 1312 5326 6765 23408 24090 26072 33037 38088 42985 46413 |
| 16th row: | 220 804 843 2921 4841 7760 8303 11259 21058 21276 34346 37604 |
| 17th row: | 676 713 832 11937 12006 12309 16329 26438 34214 37471 38179 42420 |
| 18th row: | 714 931 1580 6837 9824 11257 15556 26730 32053 34461 35889 45821 |
| 19th row: | 28 1097 1340 8767 9406 17253 29558 32857 37856 38593 41781 47101 |
| 20th row: | 158 722 754 14489 23851 28160 30371 30579 34963 44216 46462 47463 |
| 21st row: | 833 1326 1332 7032 9566 11011 21424 26827 29789 31699 32876 37498 |
| 22nd row: | 251 504 1075 4470 7736 11242 20397 32719 34453 36571 40344 46341 |
| 23rd row: | 330 581 868 15168 20265 26354 33624 35134 38609 44965 45209 46909 |
| 24th row: | 729 1643 1732 3946 4912 9615 19699 30993 33658 38712 39424 46799 |
| 25th row: | 546 982 1274 9264 11017 11868 15674 16277 19204 28606 39063 43331 |
| 26th row: | 73 1160 1196 4334 12560 13583 14703 18270 18719 19327 38985 46779 |
| 27th row: | 1147 1625 1759 3767 5912 11599 18561 19330 29619 33671 43346 44098 |
| 28th row: | 104 1507 1586 9387 17890 23532 27008 27861 30966 33579 35541 39801 |
| 29th row: | 1700 1746 1793 4941 7814 13746 20375 27441 30262 30392 35385 42848 |
| 30th row: | 183 555 1029 3090 5412 8148 19662 23312 23933 28179 29962 35514 |
| 31st row: | 891 908 1127 2827 4077 4376 4570 26923 27456 33699 43431 46071 |
| 32nd row: | 404 1110 1782 6003 14452 19247 26998 30137 31404 31624 46621 47366 |
| 33rd row: | 886 1627 1704 8193 8980 9648 10928 16267 19774 35111 38545 44735 |
| 34th row: | 268 380 1214 4797 5168 9109 9288 17992 21309 33210 36210 41429 |
| 35th row: | 572 1121 1165 6944 7114 20978 23540 25863 26190 26365 41521 44690 |
| 36th row: | 18 185 496 5885 6165 20468 23895 24745 31226 33680 37665 38587 |
| 37th row: | 289 527 1118 11275 12015 18088 22805 24679 28262 30160 34892 43212 |
| 38th row: | 658 926 1589 7634 16231 22193 25320 26057 26512 27498 29472 34219 |
| 39th row: | 337 801 1525 2023 3512 16031 26911 32719 35620 39035 43779 44316 |
| 40th row: | 248 534 670 6217 11430 24090 26509 28712 33073 33912 38048 39813 |
| 41st row: | 82 1556 1575 7879 7892 14714 22404 22773 25531 34170 38203 38254 |
| 42nd row: | 247 313 1224 3694 14304 24033 26394 28101 37455 37859 38997 41344 |
| 43rd row: | 790 887 1418 2811 3288 9049 9704 13303 14262 38149 40109 40477 |
| 44th row: | 1310 1384 1471 3716 8250 25371 26329 26997 30138 40842 41041 44921 |
| 45th row: | 86 288 367 1860 8713 18211 22628 22811 28342 28463 40415 45845 |
| 46th row: | 719 1438 1741 8258 10797 29270 29404 32096 34433 34616 36030 45597 |
| 47th row: | 215 1182 1364 8146 9949 10498 18603 19304 19803 23685 43304 45121 |
| 48th row: | 1243 1496 1537 8484 8851 16589 17665 20152 24283 28993 34274 39795 |
| 49th row: | 6320 6785 15841 16309 20512 25804 27421 28941 43871 44647 |
| 50th row: | 2207 2713 4450 12217 16506 21188 23933 28789 38099 42392 |
| 51st row: | 14064 14307 14599 14866 17540 18881 21065 25823 30341 36963 |
| 52nd row: | 14259 14396 17037 26769 29219 29319 31689 33013 35631 37319 |
| 53rd row: | 7798 10495 12868 14298 17221 23344 31908 39809 41001 41965 |

The accumulation may be performed while the rows of the sequence are being repeatedly changed by the CPM size of the PCM.

In accordance with an aspect of the present invention, there is provided an LDPC encoding method, including initializing first memory configured to store an LDPC codeword having a length of 64800 and a code rate of 4/15 and second memory; and generating the LDPC codeword corresponding to information bits by performing accumulation with respect to the second memory using a sequence corresponding to a PCM.

The accumulation may be performed at parity bit addresses that are updated using the sequence corresponding to the PCM.

The LDPC codeword may include a systematic part corresponding to the information bits and having a length of 17280, a first parity part corresponding to a dual diagonal matrix included in the PCM and having a length of 1800, and a second parity part corresponding to an identity matrix included in the PCM and having a length of 45720.

The sequence may have a number of rows equal to the sum of a value obtained by dividing a length of the systematic part, that is, 17280, by a circulant permutation matrix (CPM) size corresponding to the PCM, that is, 360, and a value obtained by dividing a length of the first parity part, that is, 1800, by the CPM size.

The sequence may be represented by the above Sequence Table.

In accordance with still another aspect of the present invention, there is provided an LDPC decoder, including a receiving unit configured to receive an LDPC codeword encoded using a sequence corresponding to a PCM and is represented by the above Sequence Table; and a decoding unit configured to restore information bits from the received LDPC codeword by performing decoding corresponding to the PCM.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Figure 1:
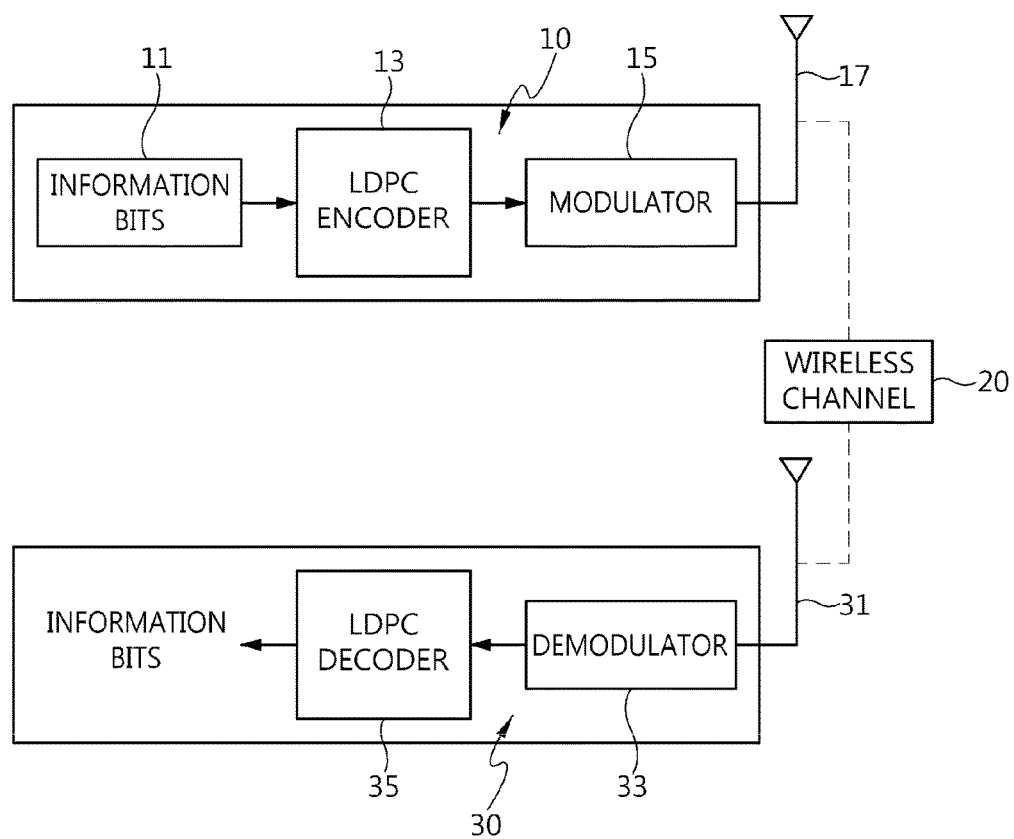
FIG. 1 is a block diagram illustrating a broadcast signal transmission and reception system according to an embodiment of the present invention.

Embodiments of the present invention will be described in detail below with reference to the accompanying drawings. Repeated descriptions and descriptions of well-known functions and configurations that have been deemed to make the gist of the present invention unnecessarily obscure will be omitted below. The embodiments of the present invention are intended to fully describe the present invention to persons having ordinary knowledge in the art to which the present invention pertains. Accordingly, the shapes, sizes, etc. of components in the drawings may be exaggerated to make the description obvious.

Embodiments of the present invention will be described in detail below with reference to the accompanying drawings.

FIG. 1 is a block diagram illustrating a broadcast signal transmission and reception system according to an embodiment of the present invention.

Referring to FIG. 1, it can be seen that a transmitter 10 and a receiver 30 communicate with each other over a wireless channel 20.

The transmitter 10 generates an n-bit codeword by encoding k information bits using an LDPC encoder 13. The codeword is modulated by the modulator 15, and is transmitted via an antenna 17. The signal transmitted via the wireless channel 20 is received via the antenna 31 of the receiver 30, and, in the receiver 30, is subjected to a process reverse to the process in the transmitter 10. That is, the received data is demodulated by a demodulator 33, and is then decoded by an LDPC decoder 35, thereby finally restoring the information bits.

It will be apparent to those skilled in the art that the above-described transmission and reception processes have been described within a minimum range required for a description of the features of the present invention and various processes required for data transmission may be added.

In the following, the specific processes of encoding and decoding that are performed using an LDPC code in the LDPC encoder 13 or LDPC decoder 35 and the specific configurations of encoding and decoding devices, such as the LDPC encoder 13 and the LDPC decoder 35, are described. The LDPC encoder 13 illustrated in FIG. 1 may have a structure illustrated in FIG. 4, and the LDPC decoder 35 may have a structure illustrated in FIG. 5.

Figure 2:
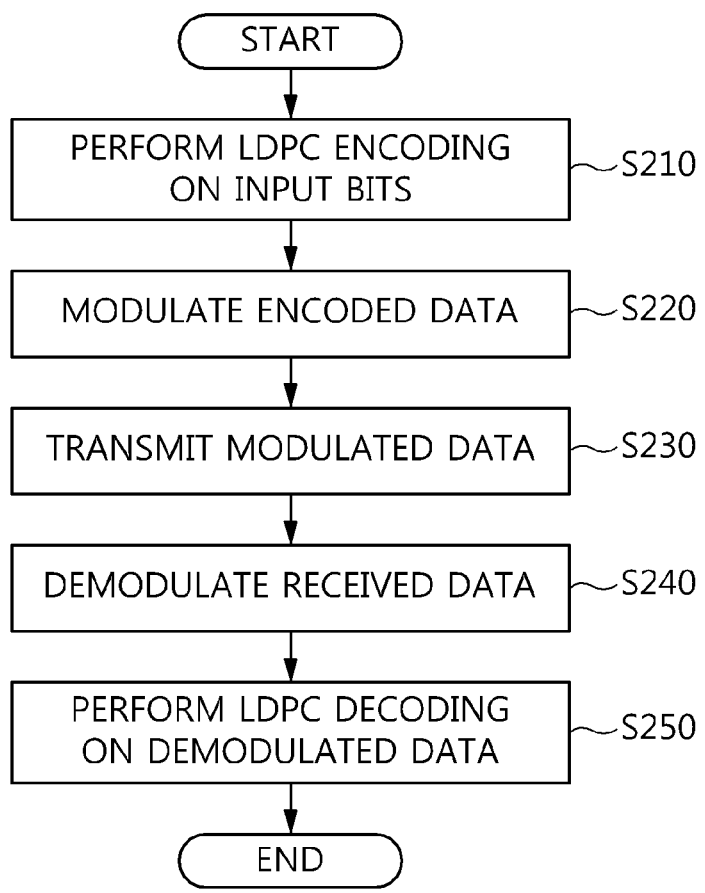
FIG. 2 is an operation flowchart illustrating a broadcast signal transmission and reception method according to an embodiment of the present invention.

FIG. 2 is an operation flowchart illustrating a broadcast signal transmission and reception method according to an embodiment of the present invention.

Referring to FIG. 2, in the broadcast signal transmission and reception method according to this embodiment of the present invention, input bits (information bits) are subjected to LDPC encoding at step S210.

That is, at step S210, an n-bit codeword is generated by encoding k information bits using the LDPC encoder.

Figure 6:
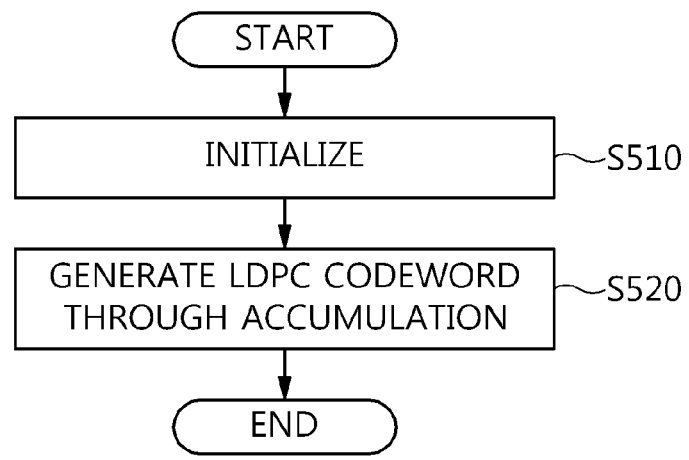
FIG. 6 is an operation flowchart illustrating an LDPC encoding method according to an embodiment of the present invention.

In this case, step S210 may be performed as in an LDPC encoding method illustrated in FIG. 6.

Furthermore, in the broadcast signal transmission and reception method, the encoded data is modulated at step S220.

That is, at step S220, the encoded n-bit codeword is modulated using the modulator.

Furthermore, in the broadcast signal transmission and reception method, the modulated data is transmitted at step S230.

That is, at step S230, the modulated codeword is transmitted over a wireless channel via the antenna.

Furthermore, in the broadcast signal transmission and reception method, the received data is demodulated at step S240.

That is, at step S240, the signal transmitted over the wireless channel is received via the antenna of the receiver, and the received data is demodulated using the demodulator.

Furthermore, in the broadcast signal transmission and reception method, the demodulated data is subjected to LDPC decoding at step S250.

That is, at step S250, the information bits are finally restored by performing LDPC decoding using the demodulator of the receiver.

Figure 5:
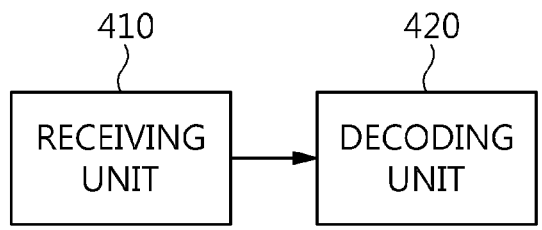
FIG. 5 is a block diagram illustrating an LDPC decoder according to an embodiment of the present invention.

In this case, step S250 corresponds to a process reverse to that of the LDPC encoding method illustrated in FIG. 6, and may correspond to the LDPC decoder of FIG. 5.

An LDPC code is known as a code very close to the Shannon limit for an additive white Gaussian noise (AWGN) channel, and has the advantages of asymptotically excellent performance and parallelizable decoding compared to a turbo code.

Generally, an LDPC code is defined by a low-density parity check matrix (PCM) that is randomly generated. However, a randomly generated LDPC code requires a large amount of memory to store a PCM, and requires a lot of time to access memory. In order to overcome these problems, a quasi-cyclic LDPC (QC-LDPC) code has been proposed. A QC-LDPC code that is composed of a zero matrix or a circulant permutation matrix (CPM) is defined by a PCM that is expressed by the following Equation 1:

$$H = \begin{bmatrix} J^{a_{11}} & J^{a_{12}} & \cdots & J^{a_{1n}} \\ J^{a_{21}} & J^{a_{22}} & \cdots & J^{a_{2n}} \\ \vdots & \vdots & \ddots & \vdots \\ J^{a_{m1}} & J^{a_{m2}} & \cdots & J^{a_{mn}} \end{bmatrix}, \text{ for } a_{ij} \in \{0, 1, \ldots, L-1, \infty\} \quad (1)$$

In this equation, J is a CPM having a size of L×L, and is given as the following Equation 2. In the following description, L may be 360.

$$J_{L \times L} = \begin{bmatrix} 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \\ 1 & 0 & 0 & \cdots & 0 \end{bmatrix} \quad (2)$$

Furthermore, $J^i$ is obtained by shifting an L×L identity matrix I ($J^0$) to the right i (0≤i<L) times, and $J^\infty$ is an L×L zero matrix. Accordingly, in the case of a QC-LDPC code, it is sufficient if only index exponent i is stored in order to store $J^i$, and thus the amount of memory required to store a PCM is considerably reduced.

Figure 3:
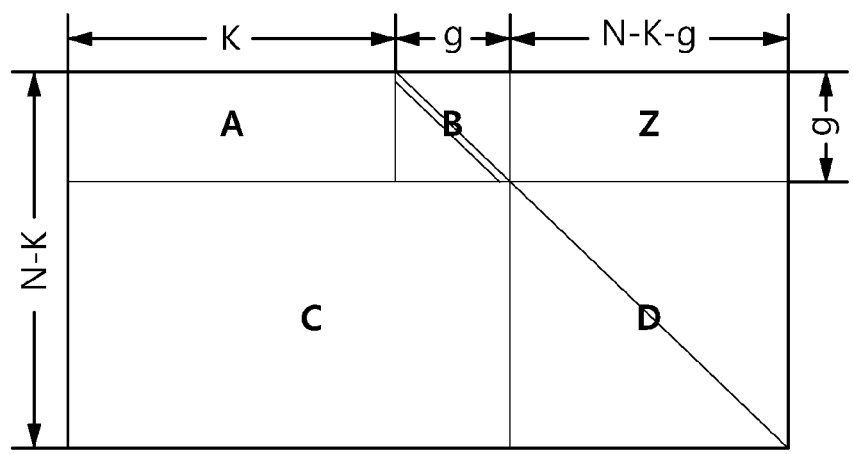
FIG. 3 is a diagram illustrating the structure of a PCM corresponding to an LDPC code to according to an embodiment of the present invention.

FIG. 3 is a diagram illustrating the structure of a PCM corresponding to an LDPC code to according to an embodiment of the present invention.

Referring to FIG. 3, the sizes of matrices A and C are g×K and (N−K−g)×(K+g), respectively, and are composed of an L×L zero matrix and a CPM, respectively. Furthermore, matrix Z is a zero matrix having a size of g×(N−K−g), matrix D is an identity matrix having a size of (N−K−g)×(N−K−g), and matrix B is a dual diagonal matrix having a size of g×g. In this case, the matrix B may be a matrix in which all elements except elements along a diagonal line and neighboring elements below the diagonal line are 0, and may be defined as the following Equation 3:

$$B_{g \times g} = \begin{bmatrix} I_{L \times L} & 0 & 0 & \cdots & 0 & 0 & 0 \\ I_{L \times L} & I_{L \times L} & 0 & \cdots & 0 & 0 & 0 \\ 0 & I_{L \times L} & I_{L \times L} & \vdots & 0 & 0 & 0 \\ \vdots & \vdots & \vdots & \ddots & \vdots & \vdots & \vdots \\ 0 & 0 & 0 & \cdots & I_{L \times L} & I_{L \times L} & 0 \\ 0 & 0 & 0 & \cdots & 0 & I_{L \times L} & I_{L \times L} \end{bmatrix} \quad (3)$$

where $I_{L \times L}$ is an identity matrix having a size of L×L.

That is, the matrix B may be a bit-wise dual diagonal matrix, or may be a block-wise dual diagonal matrix having identity matrices as its blocks, as indicated by Equation 3. The bit-wise dual diagonal matrix is disclosed in detail in Korean Patent Application Publication No. 2007-0058438, etc.

In particular, it will be apparent to those skilled in the art that when the matrix B is a bit-wise dual diagonal matrix, it is possible to perform conversion into a Quasi-cyclic form by applying row or column permutation to a PCM including the matrix B and having a structure illustrated in FIG. 3.

In this case, N is the length of a codeword, and K is the length of information.

The present invention proposes a newly designed QC-LDPC code in which the code rate thereof is 4/15 and the length of a codeword is 64800, as illustrated in the following Table 1. That is, the present invention proposes an LDPC code that is designed to receive information having a length of 17280 and generate an LDPC codeword having a length of 64800.

Table 1 illustrates the sizes of the matrices A, B, C, D and Z of the QC-LDPC code according to the present invention:

TABLE 1

| | | Sizes | | | | |
|---|---|---|---|---|---|---|
| Code rate | Length | A | B | C | D | Z |
| 4/15 | 64800 | 1800 × 17280 | 1800 × 1800 | 45720 × 19080 | 45720 × 45720 | 1800 × 45720 |

The newly designed LDPC code may be represented in the form of a sequence (progression), an equivalent relationship is established between the sequence and matrix (parity bit check matrix), and the sequence may be represented, as follows:

| | Sequence Table |
|---|---|
| 1st row: | 276 1754 1780 3597 8549 15196 26305 27003 33883 37189 41042 41849 42356 |
| 2nd row: | 730 873 927 9310 9867 17594 21969 25106 25922 31167 35434 37742 45866 |
| 3rd row: | 925 1202 1564 2575 2831 2951 5193 13096 18363 20592 33786 34090 40900 |
| 4th row: | 973 1045 1071 8545 8980 11983 18649 21323 22789 22843 26821 36720 37856 |
| 5th row: | 402 1038 1689 2466 2893 13474 15710 24137 29709 30451 35568 35966 46436 |
| 6th row: | 263 271 395 5089 5645 15488 16314 28778 29729 34350 34533 39608 45371 |
| 7th row: | 387 1059 1306 1955 6990 20001 24606 28167 33802 35181 38481 38688 45140 |
| 8th row: | 53 851 1750 3493 11415 18882 20244 23411 28715 30722 36487 38019 45416 |
| 9th row: | 810 1044 1772 3906 5832 16793 17333 17910 23946 29650 34190 40673 45828 |
| 10th row: | 97 491 948 12156 13788 24970 33774 37539 39750 39820 41195 46464 46820 |
| 11st row: | 192 899 1283 3732 7310 13637 13810 19005 24227 26772 31273 37665 44005 |
| 12th row: | 424 531 1300 4860 8983 10137 16323 16888 17933 22458 26917 27835 37931 |
| 13th row: | 130 279 731 3024 6378 18838 19746 21007 22825 23109 28644 32048 34667 |
| 14th row: | 938 1041 1482 9589 10065 11535 17477 25816 27966 35022 35025 42536 |
| 15th row: | 170 454 1312 5326 6765 23408 24090 26072 33037 38088 42985 46413 |
| 16th row: | 220 804 843 2921 4841 7760 8303 11259 21058 21276 34346 37604 |
| 17th row: | 676 713 832 11937 12006 12309 16329 26438 34214 37471 38179 42420 |
| 18th row: | 714 931 1580 6837 9824 11257 15556 26730 32053 34461 35889 45821 |
| 19th row: | 28 1097 1340 8767 9406 17253 29558 32857 37856 38593 41781 47101 |
| 20th row: | 158 722 754 14489 23851 28160 30371 30579 34963 44216 46462 47463 |
| 21st row: | 833 1326 1332 7032 9566 11011 21424 26827 29789 31699 32876 37498 |
| 22nd row: | 251 504 1075 4470 7736 11242 20397 32719 34453 36571 40344 46341 |
| 23rd row: | 330 581 868 15168 20265 26354 33624 35134 38609 44965 45209 46909 |
| 24th row: | 729 1643 1732 3946 4912 9615 19699 30993 33658 38712 39424 46799 |
| 25th row: | 546 982 1274 9264 11017 11868 15674 16277 19204 28606 39063 43331 |
| 26th row: | 73 1160 1196 4334 12560 13583 14703 18270 18719 19327 38985 46779 |
| 27th row: | 1147 1625 1759 3767 5912 11599 18561 19330 29619 33671 43346 44098 |
| 28th row: | 104 1507 1586 9387 17890 23532 27008 27861 30966 33579 35541 39801 |
| 29th row: | 1700 1746 1793 4941 7814 13746 20375 27441 30262 30392 35385 42848 |
| 30th row: | 183 555 1029 3090 5412 8148 19662 23312 23933 28179 29962 35514 |
| 31st row: | 891 908 1127 2827 4077 4376 4570 26923 27456 33699 43431 46071 |
| 32nd row: | 404 1110 1782 6003 14452 19247 26998 30137 31404 31624 46621 47366 |
| 33rd row: | 886 1627 1704 8193 8980 9648 10928 16267 19774 35111 38545 44735 |
| 34th row: | 268 380 1214 4797 5168 9109 9288 17992 21309 33210 36210 41429 |
| 35th row: | 572 1121 1165 6944 7114 20978 23540 25863 26190 26365 41521 44690 |
| 36th row: | 18 185 496 5885 6165 20468 23895 24745 31226 33680 37665 38587 |
| 37th row: | 289 527 1118 11275 12015 18088 22805 24679 28262 30160 34892 43212 |
| 38th row: | 658 926 1589 7634 16231 22193 25320 26057 26512 27498 29472 34219 |
| 39th row: | 337 801 1525 2023 3512 16031 26911 32719 35620 39035 43779 44316 |
| 40th row: | 248 534 670 6217 11430 24090 26509 28712 33073 33912 38048 39813 |
| 41st row: | 82 1556 1575 7879 7892 14714 22404 22773 25531 34170 38203 38254 |
| 42nd row: | 247 313 1224 3694 14304 24033 26394 28101 37455 37859 38997 41344 |
| 43rd row: | 790 887 1418 2811 3288 9049 9704 13303 14262 38149 40109 40477 |
| 44th row: | 1310 1384 1471 3716 8250 25371 26329 26997 30138 10842 41041 44921 |
| 45th row: | 86 288 367 1860 8713 18211 22628 22811 28342 28463 40415 45845 |
| 46th row: | 719 1438 1741 8258 10797 29270 29404 32096 34433 34616 36030 45597 |
| 47th row: | 215 1182 1364 8146 9949 10498 18603 19304 19803 23685 43304 45121 |
| 48th row: | 1243 1496 1537 8484 8851 16589 17665 20152 24283 28993 34274 39795 |
| 49th row: | 6320 6785 15841 16309 20512 25804 27421 28941 43871 44647 |
| 50th row: | 2207 2713 4450 12217 16506 21188 23933 28789 38099 42392 |
| 51st row: | 14064 14307 14599 14866 17540 18881 21065 25823 30341 36963 |
| 52nd row: | 14259 14396 17037 26769 29219 29319 31689 33013 35631 37319 |
| 53rd row: | 7798 10495 12868 14298 17221 23344 31908 39809 41001 41965 |

An LDPC code that is represented in the form of a sequence is being widely used in the DVB standard.

According to an embodiment of the present invention, an LDPC code presented in the form of a sequence is encoded, as follows. It is assumed that there is an information block $S=(s_0, s_1, \ldots, s_{K-1})$ having an information size K. The LDPC encoder generates a codeword $\Lambda=(\lambda_0, \lambda_1, \lambda_2, \ldots, \lambda_{N-1})$ having a size of $N=K+M_1+M_2$ using the information block S having a size K. In this case, $M_1=g$, and $M_2=N-K-g$. Furthermore, $M_1$ is the size of parity bits corresponding to the dual diagonal matrix B, and $M_2$ is the size of parity bits corresponding to the identity matrix D. The encoding process is performed, as follows:

Initialization:

$$\lambda_i = s_i \text{ for } i=0,1,\ldots,K-1$$

$$p_j = 0 \text{ for } j=0,1,\ldots,M_1+M_2-1 \quad (4)$$

First information bit $\lambda_0$ is accumulated at parity bit addresses specified in the 1st row of the sequence of the Sequence Table. For example, in an LDPC code having a length of 64800 and a code rate of 4/15, an accumulation process is as follows:

$p_{276}=p_{276} \oplus \lambda_0 \quad p_{1754}=p_{1754} \oplus \lambda_0 \quad p_{1780}=p_{1780} \oplus \lambda_0$
$p_{3597}=p_{3597} \oplus \lambda_0 \quad p_{8549}=p_{8549} \oplus \lambda_0$
$p_{15196}=p_{151966} \oplus \lambda_0 \quad p_{26305}=p_{26305} \oplus \lambda_0 \quad p_{27003}=p_{27003} \oplus \lambda_0$
$p_{33883}=p_{33833} \oplus \lambda_0$
$p_{37189}=p_{37189} \oplus \lambda_0 \quad p_{41042}=p_{41042} \oplus \lambda_0 \quad p_{41849}=p_{41849} \oplus \lambda_0$
$p_{42356}=p_{42356} \oplus \lambda_0$ where the addition $\oplus$ occurs in GF(2).

The subsequent L-1 information bits, that is, $\lambda_m$, m=1, 2, ..., L-1, are accumulated at parity bit addresses that are calculated by the following Equation 5:

$$(x+m \times Q_1) \mod M_1 \text{ if } x \leq M_1$$

$$M_1 + \{(x-M_1+m \times Q_2) \mod M_2\} \text{ if } x \geq M_1 \quad (5)$$

where x denotes the addresses of parity bits corresponding to the first information bit $\lambda_0$, that is, the addresses of the parity bits specified in the first row of the sequence of the Sequence Table, $Q_1=M_1/L$, $Q_2=M_2/L$, and L=360. Furthermore, $Q_1$ and $Q_2$ are defined in the following Table 2. For example, for an LDPC code having a length of 64800 and a code rate of 4/15, $M_1=1800$, $Q_1=5$, $M_2=45720$, $Q_2=127$ and L=360, and the following operations are performed on the second bit $\lambda_1$ using Equation 5:

$p_{281}=p_{281} \oplus \lambda_1 \quad p_{1759}=p_{1759} \oplus \lambda_1 \quad p_{1785}=p_{1785} \oplus \lambda_1$
$p_{3724}=p_{3724} \oplus \lambda_1 \quad p_{8676}=p_{8676} \oplus \lambda_1$ $p_{15323}=p_{15323} \oplus \lambda_1 \quad p_{26432}=p_{26432} \oplus \lambda_1$
$p_{27130}=p_{27130} \oplus \lambda_1 \quad p_{34010}=p_{34010} \oplus \lambda_1$ $p_{37316}=p_{37316} \oplus \lambda_1 \quad p_{41169}=p_{41169} \oplus \lambda_1$
$p_{41976}=p_{41976} \oplus \lambda_1 \quad p_{42483}=p_{42483} \oplus \lambda_1$ Table 2 illustrates the sizes of $M_1$, $Q_1$, $M_2$ and $Q_2$ of the designed QC-LDPC code:

TABLE 2

| Code rate | Length | Sizes | | | |
|---|---|---|---|---|---|
| | | $M_1$ | $M_2$ | $Q_1$ | $Q_2$ |
| 4/15 | 64800 | 1800 | 45720 | 5 | 127 |

The addresses of parity bit accumulators for new 360 information bits from $\lambda_L$ to $\lambda_{2L-1}$ are calculated and accumulated from Equation 5 using the second row of the sequence.

In a similar manner, for all groups composed of new L information bits, the addresses of parity bit accumulators are calculated and accumulated from Equation 5 using new rows of the sequence.

After all the information bits from $\lambda_0$ to $\lambda_{K-1}$ have been exhausted, the operations of the following Equation 6 are sequentially performed from i=1:

$$p_i = p_i \oplus p_{i-1} \text{ for } i=0,1,\ldots M_1-1 \quad (6)$$

Thereafter, when a parity interleaving operation, such as that of the following Equation 7, is performed, parity bits corresponding to the dual diagonal matrix B are generated:

$$\lambda_{K+L \cdot t+s} = p_{Q_1 \cdot s+t} \text{ for } 0 \leq s < L,\ 0 \leq t < Q_1 \quad (7)$$

When the parity bits corresponding to the dual diagonal matrix B have been generated using K information bits $\lambda_0$, $\lambda_1, \ldots, \lambda_{K-1}$, parity bits corresponding to the identity matrix D are generated using the $M_1$ generated parity bits $\lambda_K$, $\lambda_{K+1}, \ldots, \lambda_{K+M_1-1}$.

For all groups composed of L information bits from $\lambda_K$ to $\lambda_{K+M_1-1}$, the addresses of parity bit accumulators are calculated using the new rows (starting with a row immediately subsequent to the last row used when the parity bits corresponding to the dual diagonal matrix B have been generated) of the sequence and Equation 5, and related operations are performed.

When a parity interleaving operation, such as that of the following Equation 8, is performed after all the information bits from $\lambda_K$ to $\lambda_{K+M_1-1}$ have been exhausted, parity bits corresponding to the identity matrix D are generated:

$$\lambda_{K+M_1+L \cdot t+s} = p_{M_1+Q_2 \cdot s+t} \text{ for } 0 \leq s < L,\ 0 \leq t < Q_2 \quad (8)$$

Figure 4:
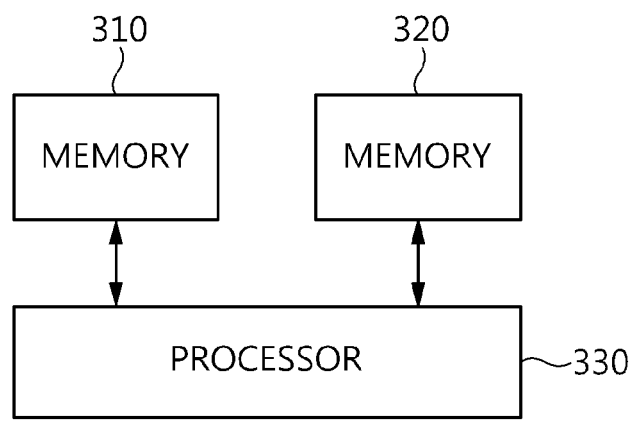
FIG. 4 is a block diagram illustrating an LDPC encoder according to an embodiment of the present invention.

FIG. 4 is a block diagram illustrating an LDPC encoder according to an embodiment of the present invention.

Referring to FIG. 4, the LDPC encoder according to this embodiment of the present invention includes memory 310 and 320 and a processor 330.

The memory 310 is memory that is used to store an LDPC codeword having a length of 64800 and a code rate of 4/15.

The memory 320 is memory that is initialized to 0.

The memory 310 and the memory 320 may correspond to $\lambda_i$ (i=0, 1, ..., N-1) and $p_j$ (j=0, 1, ..., $M_1+M_2-1$), respectively.

The memory 310 and the memory 320 may correspond to various types of hardware for storing sets of bits, and may correspond to data structures, such as an array, a list, a stack and a queue.

The processor 330 generates an LDPC codeword corresponding to information bits by performing accumulation with respect to the memory 320 using a sequence corresponding to a PCM.

In this case, the accumulation may be performed at parity bit addresses that are updated using the sequence of the above Sequence Table.

In this case, the LDPC codeword may include a systematic part $\lambda_0, \lambda_1, \ldots, \lambda_{K-1}$ corresponding to the information bits and having a length of 17280 (=K), a first parity part $\lambda_K$, $\lambda_{K+1}, \ldots, \lambda_{K+M_1-1}$ corresponding to a dual diagonal matrix included in the PCM and having a length of 1800 (=$M_1$=g), and a second parity part $\lambda_{K+M_1}$, $\lambda_{K+M_1+1}, \ldots, \lambda_{K+M_1+M_2-1}$ corresponding to an identity matrix included in the PCM and having a length of 45720 (=$M_2$).

In this case, the sequence may have a number of rows equal to the sum (17280/360+1800/360=53) of a value obtained by dividing the length of the systematic part, that is, 17280, by a CPM size L corresponding to the PCM, that is, 360, and a value obtained by dividing the length $M_1$ of the first parity part, that is, 1800, by 360.

As described above, the sequence may be represented by the above Sequence Table.

In this case, the memory 320 may have a size corresponding to the sum $M_1+M_2$ of the length $M_1$, of the first parity part and the length $M_2$ of the second parity part.

In this case, the parity bit addresses may be updated based on the results of comparing each x of the previous parity bit addresses specified in respective rows of the sequence with the length $M_1$ of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$, may be $M_1/L$, $M_1$ may be the size of the first parity part, $Q_2$ may be $M_2/L$, and $M_2$ may be the size of the second parity part.

In this case, it may be possible to perform the accumulation while repeatedly changing the rows of the sequence by the CPM size L (=360) of the PCM, as described above.

In this case, the first parity part $\lambda_K, \lambda_{K+1}, \ldots, \lambda_{K+M_1-1}$ may be generated by performing parity interleaving using the memory 310 and the memory 320, as described in conjunction with Equation 7.

In this case, the second parity part $\lambda_{K+M_1}, \lambda_{K+M_1+1}, \ldots, \lambda_{K+M_1+M_2-1}$ may be generated by performing parity interleaving using the memory 310 and the memory 320 after generating the first parity part $\lambda_K, \lambda_{K+1}, \ldots, \lambda_{K+M_1-1}$ and then performing the accumulation using the first parity part $\lambda_K, \lambda_{K+1}, \ldots, \lambda_{K+M_1-1}$ and the sequence, as described in conjunction with Equation 8.

FIG. 5 is a block diagram illustrating an LDPC decoder according to an embodiment of the present invention.

Referring to FIG. 5, the LDPC decoder according to this embodiment of the present invention may include a receiving unit 410 and a decoding unit 420.

The receiving unit 410 receives an LDPC codeword that has been encoded using a sequence that corresponds to a PCM and is represented by the above Sequence Table.

The decoding unit 420 restores information bits from the received LDPC codeword by performing decoding corresponding to the PCM.

In this case, the sequence may be used to update the parity bit addresses of the memory, and the parity bit addresses are used for accumulation that is performed to generate parity bits corresponding to the LDPC codeword.

In this case, the LDPC codeword may include a systematic part $\lambda_0, \lambda_1, \ldots, \lambda_{K-1}$ corresponding to the information bits, a first parity part $\lambda_K, \lambda_{K+1}, \ldots, \lambda_{K+M_1-1}$ corresponding to a dual diagonal matrix included in the PCM, and a second parity part $\lambda_{K+M_1}, \lambda_{K+M_1+1}, \ldots, \lambda_{K+M_1+M_2-1}$ corresponding to an identity matrix included in the PCM.

In this case, the parity bit addresses may be updated based on the results of comparing each x of the previous parity bit addresses specified in respective rows of the sequence with the length $M_1$, of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$ may be $M_1/L$, $M_1$ may be the size of the first parity part, $Q_2$ may be $M_2/L$, and $M_2$ may be the size of the second parity part.

FIG. 6 is an operation flowchart illustrating an LDPC encoding method according to an embodiment of the present invention.

Referring to FIG. 6, the LDPC encoding method according to this embodiment of the present invention initializes the first memory that stores an LDPC codeword having a length of 64800 and a code rate of 4/15, and second memory at step S510.

In this case, step S510 may be performed using Equation 4.

Furthermore, in the LDPC encoding method according to this embodiment of the present invention, an LDPC codeword corresponding to information bits is generated by performing accumulation with respect to the second memory using a sequence corresponding to a PCM at step S520.

In this case, the accumulation may be performed at parity bit addresses that are updated using the sequence corresponding to the PCM.

In this case, the LDPC codeword may include a systematic part $\lambda_0, \lambda_1, \ldots, \lambda_{K-1}$ corresponding to the information bits and having a length of 17280 (=K), a first parity part $\lambda_K, \lambda_{K+1}, \ldots, \lambda_{K+M_1-1}$ corresponding to a dual diagonal matrix included in the PCM and having a length of 1800 (=$M_1$=g), and a second parity part $\lambda_{K+M_1}, \lambda_{K+M_1+1}, \ldots, \lambda_{K+M_1+M_2-1}$ corresponding to an identity matrix included in the PCM and having a length of 45720 (=$M_2$).

In this case, the sequence may have a number of rows equal to the sum (17280/360+1800/360=53) of a value obtained by dividing the length of the systematic part, that is, 17280, by a CPM size L corresponding to the PCM, that is, 360, and a value obtained by dividing the length $M_1$ of the first parity part, that is, 1800, by 360.

As described above, the sequence may be represented by the above Sequence Table.

In this case, the parity bit addresses may be updated based on the results of comparing each x of the previous parity bit addresses specified in respective rows of the sequence with the length $M_1$ of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$ may be $M_1/L$, $M_1$ may be the size of the first parity part, $Q_2$ may be $M_2/L$, and $M_2$ may be the size of the second parity part.

In this case, it may be possible to perform the accumulation while repeatedly changing the rows of the sequence by the CPM size L (=360) of the PCM, as described above.

In this case, the first parity part $\lambda_K, \lambda_{K+1}, \ldots, \lambda_{K+M_1-1}$ may be generated by performing parity interleaving using the memory 310 and the memory 320, as described in conjunction with Equation 7.

In this case, the second parity part $\lambda_{K+M_1}, \lambda_{K+M_1+1}, \ldots, \lambda_{K+M_1+M_2-1}$ may be generated by performing parity interleaving using the memory 310 and the memory 320 after generating the first parity part $\lambda_K, \lambda_{K+1}, \ldots, \lambda_{K+M_1-1}$ and then performing the accumulation using the first parity part $\lambda_K, \lambda_{K+1}, \ldots, \lambda_{K+M_1-1}$ and the sequence, as described in conjunction with Equation 8.

Figure 7:
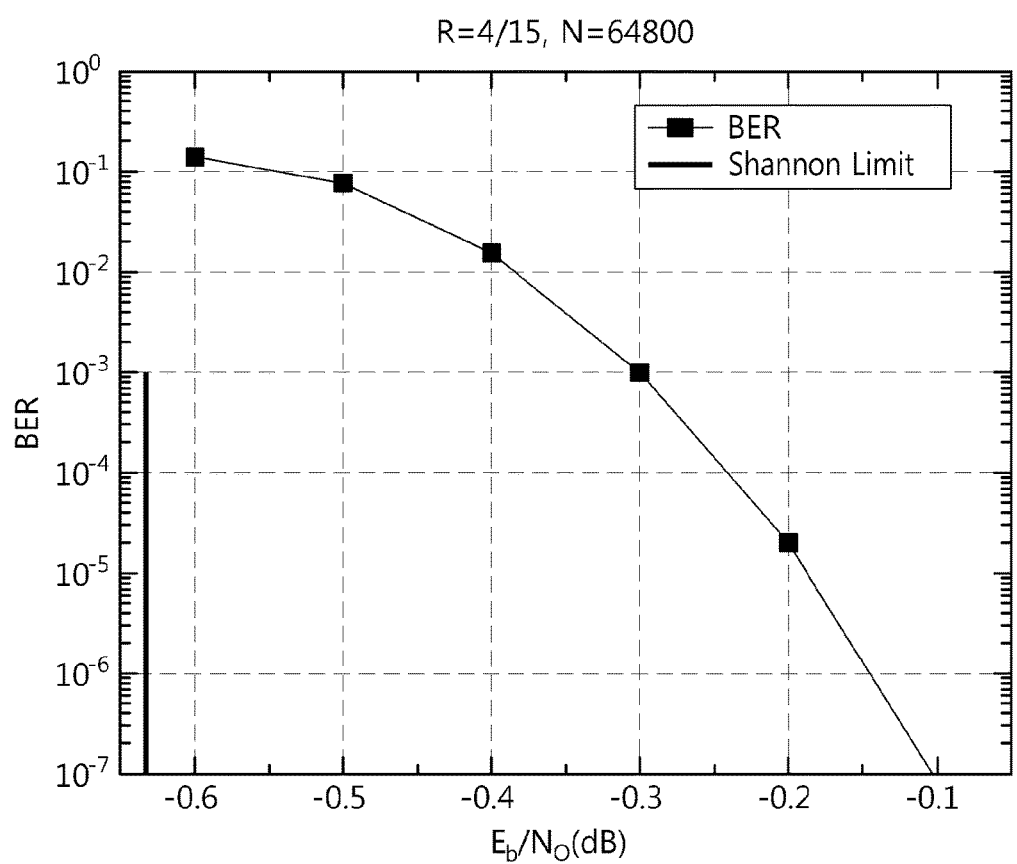
FIG. 7 is a graph plotting the performance of a QC-LDPC code having a length of 64800 and a code rate of 4/15 according to an embodiment of the present invention against $E_b/N_o$.

FIG. 7 is a graph plotting the performance of a QC-LDPC code having a length of 64800 and a code rate of 4/15 according to an embodiment of the present invention against $E_b/N_o$.

The graph illustrated in FIG. 7 illustrates results that were obtained on the assumption that a log-likelihood ratio (LLR)-based sum-product algorithm in which binary phase shift keying (BPSK) modulation and 50 rounds of repetitive decoding were performed was used for computational experiments. As illustrated in FIG. 7, it can be seen that the designed code is away from the Shannon limit by about 0.5 dB at BER=$10^{-6}$.

At least one embodiment of the present invention has the advantage of providing a new LDPC codeword having a length of 64800 and a code rate of 4/15, which is capable of being used for general purposes.

At least one embodiment of the present invention has the advantage of providing an LDPC encoding technique that is capable of efficiently performing LDPC encoding using a sequence having a number of rows equal to a value that is obtained by dividing the sum of the length of the systematic part of an LDPC codeword, that is, 17280, and the length of the first parity part of the LDPC codeword, that is, 1800, by 360.

Although the specific embodiments of the present invention have been disclosed for illustrative purposes, those skilled in the art will appreciate that various modifications, additions and substitutions are possible without departing from the scope and spirit of the invention as disclosed in the accompanying claims.

What is claimed is:

1. A low density parity check (LDPC) encoding method, comprising:
   initializing first memory configured to store an LDPC codeword having a length of 64800 and a code rate of 4/15, and second memory;
   generating the LDPC codeword corresponding to information bits by performing accumulation at parity bit addresses of the second memory using a sequence corresponding to a parity check matrix (PCM), and
   outputting the LDPC codeword generated by using the sequence for generating a transmission signal transmitted over a wireless channel, the LDPC codeword including parity bits for correcting errors occurring over the wireless channel,
   wherein the parity bit addresses are updated using the sequence, and
   wherein the sequence is represented by the following Sequence Table:

| | |
|---|---|
| 1st row: | 276 1754 1780 3597 8549 15196 26305 27003 33883 37189 41042 41849 42356 |
| 2nd row: | 730 873 927 9310 9867 17594 21969 25106 25922 31167 35434 37742 45866 |
| 3rd row: | 925 1202 1564 2575 2831 2951 5193 13096 18363 20592 33786 34090 40900 |
| 4th row: | 973 1045 1071 8545 8980 11983 18649 21323 22789 22843 26821 36720 37856 |
| 5th row: | 402 1038 1689 2466 2893 13474 15710 24137 29709 30451 35568 35966 46436 |
| 6th row: | 263 271 395 5089 5645 15488 16314 28778 29729 34350 34533 39608 45371 |
| 7th row: | 387 1059 1306 1955 6990 20001 24606 28167 33802 35181 38481 38688 45140 |
| 8th row: | 53 851 1750 3493 11415 18882 20244 23411 28715 30722 36487 38019 45416 |
| 9th row: | 810 1044 1772 3906 5832 16793 17333 17910 23946 29650 34190 40673 45828 |
| 10th row: | 97 491 948 12156 13788 24970 33774 37539 39750 39820 41195 46464 46820 |
| 11st row: | 192 899 1283 3732 7310 13637 13810 19005 24227 26772 31273 37665 44005 |
| 12th row: | 424 531 1300 4860 8983 10137 16323 16888 17933 22458 26917 27835 37931 |
| 13th row: | 130 279 731 3024 6378 18838 19746 21007 22825 23109 28644 32048 34667 |
| 14th row: | 938 1041 1482 9589 10065 11535 17477 25816 27966 35022 35025 42536 |
| 15th row: | 170 454 1312 5326 6765 23408 24090 26072 33037 38088 42985 46413 |
| 16th row: | 220 804 843 2921 4841 7760 8303 11259 21058 21276 34346 37604 |
| 17th row: | 676 713 832 11937 12006 12309 16329 26438 34214 37471 38179 42420 |
| 18th row: | 714 931 1580 6837 9824 11257 15556 26730 32053 34461 35889 45821 |
| 19th row: | 28 1097 1340 8767 9406 17253 29558 32857 37856 38593 41781 47101 |
| 20th row: | 158 722 754 14489 23851 28160 30371 30579 34963 44216 46462 47463 |
| 21st row: | 833 1326 1332 7032 9566 11011 21424 26827 29789 31699 32876 37498 |
| 22nd row: | 251 504 1075 4470 7736 11242 20397 32719 34453 36571 40344 46341 |
| 23rd row: | 330 581 868 15168 20265 26354 33624 35134 38609 44965 45209 46909 |
| 24th row: | 729 1643 1732 3946 4912 9615 19699 30993 33658 38712 39424 46799 |
| 25th row: | 546 982 1274 9264 11017 11868 15674 16277 19204 28606 39063 43331 |
| 26th row: | 73 1160 1196 4334 12560 13583 14703 18270 18719 19327 38985 46779 |
| 27th row: | 1147 1625 1759 3767 5912 11599 18561 19330 29619 33671 43346 44098 |
| 28th row: | 104 1507 1586 9387 17890 23532 27008 27861 30966 33579 35541 39801 |
| 29th row: | 1700 1746 1793 4941 7814 13746 20375 27441 30262 30392 35385 42848 |
| 30th row: | 183 555 1029 3090 5412 8148 19662 23312 23933 28179 29962 35514 |
| 31st row: | 891 908 1127 2827 4077 4376 4570 26923 27456 33699 43431 46071 |
| 32nd row: | 404 1110 1782 6003 14452 19247 26998 30137 31404 31624 46621 47366 |
| 33rd row: | 886 1627 1704 8193 8980 9648 10928 16267 19774 35111 38545 44735 |
| 34th row: | 268 380 1214 4797 5168 9109 9288 17992 21309 33210 36210 41429 |
| 35th row: | 572 1121 1165 6944 7114 20978 23540 25863 26190 26365 41521 44690 |
| 36th row: | 18 185 496 5885 6165 20468 23895 24745 31226 33680 37665 38587 |
| 37th row: | 289 527 1118 11275 12015 18088 22805 24679 28262 30160 34892 43212 |
| 38th row: | 658 926 1589 7634 16231 22193 25320 26057 26512 27498 29472 34219 |
| 39th row: | 337 801 1525 2023 3512 16031 26911 32719 35620 39035 43779 44316 |
| 40th row: | 248 534 670 6217 11430 24090 26509 28712 33073 33912 38048 39813 |
| 41st row: | 82 1556 1575 7879 7892 14714 22404 22773 25531 34170 38203 38254 |
| 42nd row: | 247 313 1224 3694 14304 24033 26394 28101 37455 37859 38997 41344 |
| 43rd row: | 790 887 1418 2811 3288 9049 9704 13303 14262 38149 40109 40477 |
| 44th row: | 1310 1384 1471 3716 8250 25371 26329 26997 30138 40842 41041 44921 |
| 45th row: | 86 288 367 1860 8713 18211 22628 22811 28342 28463 40415 45845 |
| 46th row: | 719 1438 1741 8258 10797 29270 29404 32096 34433 34616 36030 45597 |
| 47th row: | 215 1182 1364 8146 9949 10498 18603 19304 19803 23685 43304 45121 |
| 48th row: | 1243 1496 1537 8484 8851 16589 17665 20152 24283 28993 34274 39795 |
| 49th row: | 6320 6785 15841 16309 20512 25804 27421 28941 43871 44647 |
| 50th row: | 2207 2713 4450 12217 16506 21188 23933 28789 38099 42392 |
| 51st row: | 14064 14307 14599 14866 17540 18881 21065 25823 30341 36963 |

-continued

| | |
|---|---|
| 52nd row: | 14259 14396 17037 26769 29219 29319 31689 33013 35631 37319 |
| 53rd row: | 7798 10495 12868 14298 17221 23344 31908 39809 41001 41965. |

2. The LDPC encoding method of claim 1, wherein the LDPC codeword comprises a systematic part corresponding to the information bits and having a length of 17280, a first parity part corresponding to a dual diagonal matrix included in the PCM and having a length of 1800, and a second parity part corresponding to an identity matrix included in the PCM and having a length of 45720.

3. The LDPC encoding method of claim 2, wherein the sequence has a number of rows equal to a sum of a value obtained by dividing a length of the systematic part, that is, 17280, by a circulant permutation matrix (CPM) size corresponding to the PCM, that is, 360, and a value obtained by dividing a length of the first parity part, that is, 1800, by the CPM size.

4. The LDPC encoding method of claim 3, wherein the accumulation is performed at parity bit addresses that are updated using the sequence.

5. The LDPC encoding method of claim 4, wherein the accumulation is performed while the rows of the sequence are being repeatedly changed by the CPM size of the PCM.

* * * * *